(12) United States Patent
Kawashima

(10) Patent No.: US 7,920,000 B2
(45) Date of Patent: Apr. 5, 2011

(54) PLL CIRCUIT AND METHOD OF CONTROLLING THE SAME

(75) Inventor: Toshitsugu Kawashima, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 12/591,824

(22) Filed: Dec. 2, 2009

(65) Prior Publication Data

US 2010/0134157 A1 Jun. 3, 2010

(30) Foreign Application Priority Data

Dec. 3, 2008 (JP) ................................. 2008-308131

(51) Int. Cl.
*H03L 7/06* (2006.01)
(52) U.S. Cl. ........................................ 327/156; 327/157
(58) Field of Classification Search .................. 327/147, 327/156
See application file for complete search history.

(56) References Cited

U.S. PATENT DOCUMENTS

| | | | |
|---|---|---|---|
| 4,994,768 A * | 2/1991 | Shepherd et al. | 332/127 |
| 6,008,703 A * | 12/1999 | Perrott et al. | 332/100 |
| 6,049,254 A | 4/2000 | Knapp et al. | |
| 6,157,271 A * | 12/2000 | Black et al. | 332/127 |
| 7,109,764 B2 | 9/2006 | Sakamoto | |
| 7,279,993 B2 * | 10/2007 | Bruno et al. | 331/34 |
| 7,391,270 B2 * | 6/2008 | Neurauter et al. | 331/16 |
| 7,443,215 B1 * | 10/2008 | Sidiropoulos | 327/156 |
| 7,583,774 B2 * | 9/2009 | Lesso | 375/377 |
| 7,647,033 B2 * | 1/2010 | Uozumi et al. | 455/260 |
| 7,679,468 B1 * | 3/2010 | Groe et al. | 332/128 |
| 2002/0089384 A1 | 7/2002 | Ichihara | |
| 2010/0020912 A1 * | 1/2010 | Lesso | 375/376 |
| 2010/0134157 A1 * | 6/2010 | Kawashima | 327/156 |

FOREIGN PATENT DOCUMENTS

| | | |
|---|---|---|
| JP | 2001-520471 | 10/2001 |
| JP | 2002-208857 | 7/2002 |
| JP | 2005-143030 | 6/2005 |

* cited by examiner

*Primary Examiner* — Lincoln Donovan
*Assistant Examiner* — Adam D Houston
(74) *Attorney, Agent, or Firm* — McGinn IP Law Group, PLLC

(57) ABSTRACT

A PLL circuit according to an exemplary aspect of the present invention includes: a PFD that detects a phase difference between two clock signals; an LPF that outputs a voltage based on a detection result of the PFD; a VCO that controls a frequency of a VCO output clock output based on the voltage; a frequency divider that divides a frequency of the VCO output clock and outputs an output clock; and an automatic adjustment circuit that adjusts a frequency division ratio of the frequency divider based on the voltage. The automatic adjustment circuit includes a comparison circuit that outputs a control signal for controlling the frequency divider and a control signal for controlling the reference voltage. This circuit configuration makes it possible to control an oscillation frequency of a PLL circuit with accuracy and stability.

13 Claims, 11 Drawing Sheets

PLL CIRCUIT AND METHOD OF CONTROLLING THE SAME

BACKGROUND

1. Field of the Invention

The present invention relates to a PLL circuit and a method of controlling the same.

2. Description of Related Art

In recent years, speed-up of a high definition multimedia interface (HDMI) is remarkable. One of the most important components of transmission/reception circuits conforming to the HDMI is a wideband phase locked loop (PLL). A PLL provided in the reception circuit receives a reference clock, which is transmitted from the transmission circuit, through an HDMI clock channel. The PLL outputs a clock obtained by multiplying the frequency of the reference clock. In this case, the clock output from the PLL is required to have a frequency corresponding to a transmission rate of an HDMI data channel. The frequency of the HDMI data channel varies in a range from several hundred MHz to several GHz. In other others, the PLL provided in the reception circuit is required to accurately lock (synchronize) the data cannel having such a wide frequency range. Moreover, random jitter of the clock output from the PLL is required to be suppressed below a predetermined value which is set depending on a transmission error rate or the like.

Reference is now made to FIG. 4 showing a PLL circuit of a related art. The PLL circuit shown in FIG. 4 includes a phase frequency detector (hereinafter abbreviated as "PFD") 301, a charge pump (hereinafter abbreviated as "CP") 302, a loop filter (hereinafter abbreviated as "LPF") 303, a voltage controlled oscillator (hereinafter abbreviated as "VCO") 305, a 1/N programmable frequency divider 307, and a 1/M programmable frequency divider 309.

The PFD 301 receives a reference clock 310 which is externally supplied and a comparison clock which is obtained by dividing the frequency of an output clock of the PLL circuit into 1/M (M is an integer equal to or greater than 1; frequency division ratio M). The PFD 301 detects a phase difference between the two signals and outputs a pulse signal corresponding to the phase difference. The CP 302 outputs a voltage signal corresponding to the pulse signal output from the PFD 301. The LPF 303 converts the signal output from the CP 302 into a DC signal, and outputs the converted signal as a control voltage 304. The VCO 305 outputs a clock signal having a frequency corresponding to the control voltage 304 as a VCO output clock 306. The 1/N programmable frequency divider 307 divides the frequency of the VCO output clock 306 into 1/N (N is an integer equal to or greater than 1; frequency division ratio N), and outputs the clock thus obtained as an output clock 308 of the PLL circuit. The 1/M programmable frequency divider 309 divides the frequency of the output clock 308 into 1/M (M is an integer equal to or greater than 1; frequency division ratio M), and outputs the clock thus obtained as the comparison clock of the PFD 301. Now, consideration is given to a case where the frequency division ratio of the 1/N programmable frequency divider 307 is "1" (N=1). In this case, the PLL circuit outputs the output clock 308 which is obtained by multiplying the frequency of the reference clock 310 by M.

FIG. 5 shows a typical relation between the control voltage 304 input to the VCO 305 and the frequency of the VCO output clock 306. As shown in FIG. 5, when the control voltage 304 input to the VCO 305 increases, the frequency of the VCO output clock 306 increases in proportion to the voltage.

FIG. 6 shows a typical relation between the frequency of the VCO output clock 306 and random jitter of the VCO output clock 306. As shown in FIG. 6, in general, when the frequency of the VCO output clock 306 exceeds a certain frequency range, the random jitter of the VCO output clock 306 increases rapidly. Similarly, when the frequency of the VCO output clock 306 falls below a certain frequency range, the random jitter of the VCO output clock 306 increases rapidly. The example of FIG. 6 shows a state where the random jitter increases rapidly when the frequency of the VCO output clock 306 is lower than F1 and when the frequency of the VCO output clock 306 is higher than F2. For example, an upper limit of the random jitter allowed by the PLL circuit is represented by R1. In this case, in the example shown in FIG. 6, the value of the random jitter is equal to or smaller than R1 when the frequency of the VCO output clock 306 is in a range from F1 to F2.

On the other hand, a minimum frequency required for the output clock 308 of the PLL circuit is represented by FL. A maximum frequency of the output clock 308 required for the PLL circuit is represented by FH (where FL<FH). In this case, it is desirable that all the frequencies of the output clock 308 of the PLL circuit fall within a frequency range from FL to FH, while the frequency division ratio of the 1/N programmable frequency divider 307 is maintained at N=1. However, in practice, it is extremely difficult to satisfy the requirement for low random jitter in such a wide frequency range.

Referring to FIGS. 5 and 6, consideration is given to a case where the frequency division ratio of the 1/N programmable frequency divider 307 is "1" (N=1), for example. That is, consideration is given to a case where the frequency of the output clock 308 is equal to the frequency of the VCO output clock 306. In this case, as shown in FIG. 6, when the frequency of the VCO output clock 306 is equal to FH, the random jitter is equal to or smaller than the allowable value R1. Meanwhile, when the frequency of the VCO output clock is equal to FL, the random jitter exceeds the allowable value R1. As shown in FIG. 5, in order to set the minimum frequency FL of the VCO output clock 306 to be equal to or higher than F1, the control voltage 304 needs to be increased. For this reason, the PLL circuit preferably includes a function of controlling the frequency division ratio of the 1/N programmable frequency divider 307 and the like. This makes it possible to automatically adjust the control voltage 304 to indicate a value in a range from V1 to V2 at all times. An example of such a control method is disclosed in Japanese Unexamined Patent Application Publication No. 2005-143030.

FIG. 8 shows a PLL clock signal generation circuit disclosed in Japanese Unexamined Patent Application Publication No. 2005-143030. The circuit shown in FIG. 8 includes a phase frequency detector (PFD) 101, a charge pump (CP) 102, a filter (LPF) 103, a voltage controlled oscillator (VCO) 104, a first frequency divider 105, a second frequency divider 106, and a multiplication ratio control circuit 107. As shown in FIG. 9, the multiplication ratio control circuit 107 includes a first Schmitt trigger circuit 201 for detecting an upper limit of a reference voltage, a second Schmitt trigger circuit 202 for detecting a lower limit of the reference voltage, an AND gate 203 for detecting a state, an NOR gate 204 for detecting a state, a D flip-flop 205 for switching the frequency dividers, an AND gate 206, and an OR gate 207.

A reference voltage (control voltage) LPFIN output from the filter 103 is input to the voltage controlled oscillator 104, and is also input to the two Schmitt trigger circuits 201 and 202 included in the multiplication ratio control circuit 107. As shown in FIG. 10, in the Schmitt trigger circuit 201, when the reference voltage LPFIN exceeds an upper limit VCH of a voltage range in which the voltage controlled oscillator 104 normally operates, the output signal changes from the "L" state to the "H" state. Meanwhile, as shown in FIG. 11, in the Schmitt trigger circuit 202, when the reference voltage LPFIN falls below a lower limit VCL of the voltage range in which the voltage controlled oscillator 104 normally operates, the output signal changes from the "H" state to the "L" state.

The PLL clock signal generation circuit shown in FIG. 8 is intended to maintain a correct locked (synchronized) state even if the frequency range of the reference clock is increased when the input voltage range in which the voltage controlled oscillator 104 normally operates is narrow.

To achieve this function, the multiplication ratio control circuit 107 controls the frequency division ratio of each of the first frequency divider 105 and the second frequency divider 106 so that the value of the reference voltage LPFIN is constantly maintained within the voltage range in which the voltage controlled oscillator 104 normally operates (i.e., a voltage range from the lower limit VCL to the upper limit VCH; hereinafter simply referred to as "lower limit VCL" and "upper limit VCH"). Specifically, when the Schmitt trigger circuit 201 detects that the reference voltage LPFIN exceeds the upper limit VCH, the frequency division ratio of each of the first frequency divider 105 and the second frequency divider 106 is decreased by one step. That is, the frequency of a comparison clock DIVOUT which is input to the phase frequency detector 101 is increased by one step. In this case, due to a correction made by the phase frequency detector 101, the oscillation frequency of the voltage controlled oscillator 104 decreases. That is, the reference voltage LPFIN decreases. Meanwhile, when the Schmitt trigger circuit 202 detects that the reference voltage LPFIN falls below the lower limit VCL, the frequency division ratio of each of the first frequency divider 105 and the second frequency divider 106 is increased by one step. That is, the frequency of the comparison clock DIVOUT input to the phase frequency detector 101 is decreased by one step. In this case, due to a correction made by the phase frequency detector 101, the oscillation frequency of the voltage controlled oscillator 104 increases. As a result, the reference voltage LPFIN increases.

Even when the PLL circuit is normally locked and operated, the reference voltage LPFIN input to the voltage controlled oscillator 104 constantly fluctuates by a small amount due to a ripple voltage component output from the filter 103. Accordingly, when the reference voltage LPFIN indicates a value near the upper limit VCH or the lower limit VCL, the operation of the PLL circuit may become unstable. To avoid such a phenomenon, in the circuit shown in FIG. 8, the Schmitt trigger circuits 201 and 202 having hysteresis characteristics control the reference voltage LPFIN. Thus, even when the reference voltage LPFIN fluctuates due to the influence of the ripple voltage, the multiplication ratio control circuit 107 can output a stable control signal LPFOUT. Therefore, the operation of the PLL circuit can be stabilized.

As described above, in the PLL clock generation circuit shown in FIG. 8, the reference voltage LPFIN input to the voltage controlled oscillator 104 is controlled at a value within the voltage range in which the voltage controlled oscillator 104 normally operates (i.e., the voltage range from the lower limit VCL to the upper limit VCH). Herein, proper values (ideal values) of the upper limit VCH and the lower limit VCL are referred to as "VCH_ideal" and "VCL_ideal", respectively. There are various possible methods of determining the ideal values VCH_ideal and VCL_ideal. For example, a method of determining the ideal values by performing a circuit simulation on the voltage controlled oscillator 104, or a method of determining the ideal values based on a measurement result of a device mounted in the voltage controlled oscillator 104 may be employed.

In this case, it is extremely important to match the upper limit VCH and the lower limit VCL with the ideal values VCH_ideal and VCL_ideal, respectively, as accurately as possible. If the upper limit VCH is set to a value greater than the ideal value VCH_ideal, the reference voltage LPFIN deviates from the normal operating range of the voltage controlled oscillator 104, as a result of automatic adjustment. Similarly, when the lower limit VCL is set to a value smaller than the ideal value VCL_ideal, the reference voltage LPFIN deviates from the normal operating range of the voltage controlled oscillator 104, as a result of automatic adjustment. This leads to a fear that the PLL fails to operate properly. Meanwhile, when the upper limit VCH is set to a value smaller than the ideal value VCH_ideal, the reference voltage LPFIN does not take any value within the entire normal operating range of the voltage controlled oscillator 104. Similarly, when the lower limit VCL is set to a value greater than the ideal value VCL_ideal, the reference voltage LPFIN does not take any value within the entire normal operating range of the voltage controlled oscillator 104. In other words, excessively strict limitations are imposed on the operating range of the PLL circuit.

In the related art shown in FIG. 8, it appears that values generated during the actual circuit operation are set as the ideal values VCH_ideal and VCL_ideal. That is, in this example, it appears that threshold voltages determined by the actual operation of each of the Schmitt trigger circuits 201 and 202 are set as the ideal values VCH_ideal and VCL_ideal. In general, however, threshold values of the Schmitt trigger circuits are susceptible to variations in a manufacturing process, operating voltage, operating temperature, and the like of an LSI. Accordingly, the threshold voltage of each Schmitt trigger circuit may fluctuate by several tens of percent of a power supply voltage due to the influence of such variations. Therefore, it is difficult for the circuit shown in FIG. 8 to accurately detect that the reference voltage LPFIN indicates a value within the normal operating range (i.e., a value within a range from VCH_ideal to VCL_ideal). In other words, it is difficult for the circuit shown in FIG. 8 to automatically adjust the clock frequency accurately. Suppose that a function of adjusting the upper limit VCH and the lower limit VCL in response to a control signal externally supplied is provided so as to cope with a case where there is a difference in characteristics of the voltage controlled oscillator 104 between an electrical simulation result and a measurement result of an actual LSI, for example. Even in such a case, it is difficult to adjust the values of the upper limit VCH and the lower limit VCL themselves, since the threshold value of each Schmitt trigger circuit cannot be determined with accuracy.

FIG. 12 shows a PLL circuit disclosed in Published Japanese Translation of PCT International Publication for Patent Application, No. 2001-520471. The circuit shown in FIG. 12 includes a PFD 14, a loop filter (LPF) 18, a VCO 20, a CLK frequency divider 22, a determination circuit 30, and a control unit 32. According to the technique disclosed in Published Japanese translation of PCT International Publication for Patent Application, No. 2001-520471, when the frequency of a reference clock input to the PLL circuit has a wide frequency range, the frequency multiplication ratio of the PLL circuit is automatically adjusted. Thus, it is intended that the output clock frequency of the PLL circuit is maintained relatively constant. As shown in FIG. 12, the determination circuit 30 determines whether a voltage (control voltage) input to the VCO 20 falls within a set voltage range. Then, the control unit 32 controls the multiplication ratio of the CLK frequency divider 22 based on the determination result. Thus, the frequency of the clock signal output from the PLL circuit is stabilized. In the circuit shown in FIG. 12, however, there is disclosed no method to control a control voltage of a circuit having hysteresis characteristics. Accordingly, there is a fear that the operation of the PLL circuit becomes unstable due to a small voltage fluctuation.

The PLL circuit and control method therefor disclosed in Japanese Unexamined Patent Application Publication No. 2002-208857 are intended to automatically adjust the oscillation frequency range of the PLL circuit. The PLL circuit disclosed in Japanese Unexamined Patent Application Publication No. 2002-208857 includes a voltage-controlled variable oscillator (FIG. 13) capable of controlling the oscillation frequency range stepwise. As shown in FIG. 13, the magnitudes of capacitances added to oscillation nodes of an LC tank-type voltage controlled oscillator are switched by control signals CONT0, CONT1, CONT2, and CONT3, thereby controlling the oscillation frequency of the voltage controlled oscillator. However, also in the circuit shown in FIG. 13, there is disclosed no method to control a control voltage of a circuit having hysteresis characteristics. Accordingly, there is a fear that the operation of the PLL circuit becomes unstable due to a small voltage fluctuation.

SUMMARY

The present inventor has found a problem that conventional PLL circuits fail to control an oscillation frequency with accuracy and stability, as described above.

A first exemplary aspect of the present invention is a PLL circuit including: a phase frequency detector that detects a phase difference between a reference signal and a feedback signal; a filter circuit that outputs a control voltage based on an output signal from the phase frequency detector; a voltage control oscillation circuit that controls a frequency of a clock signal output based on the control voltage; a frequency dividing circuit that divides the frequency of the clock signal and outputs the feedback signal; and an automatic adjustment circuit that adjusts a frequency division ratio of the frequency dividing circuit based on the control voltage. In the PLL circuit of the first exemplary aspect of the present invention, the automatic adjustment circuit includes: a comparison circuit that outputs a first control signal for controlling the frequency division ratio based on a potential difference between the control voltage and a first reference voltage, and outputs a second control signal for controlling the first reference voltage; and a reference voltage selection circuit that selects the first reference voltage based on the second control signal and outputs the first reference voltage selected.

A second exemplary aspect of the present invention is a method of controlling a PLL circuit, including: detecting a phase difference between a reference signal and a feedback signal; generating a control voltage based on the phase difference; controlling a frequency of a clock signal output based on the control voltage; controlling a frequency division ratio of the clock signal based on a potential difference between the control voltage and a first reference voltage, to generate the feedback signal; and controlling the first reference voltage based on the potential difference between the control voltage and the first reference voltage.

With the circuit configuration described above, the oscillation frequency of the PLL circuit can be controlled with accuracy and stability.

According to exemplary aspects of the present invention, it is possible to provide a PLL circuit capable of controlling an oscillation frequency with accuracy and stability.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

Figure 1:
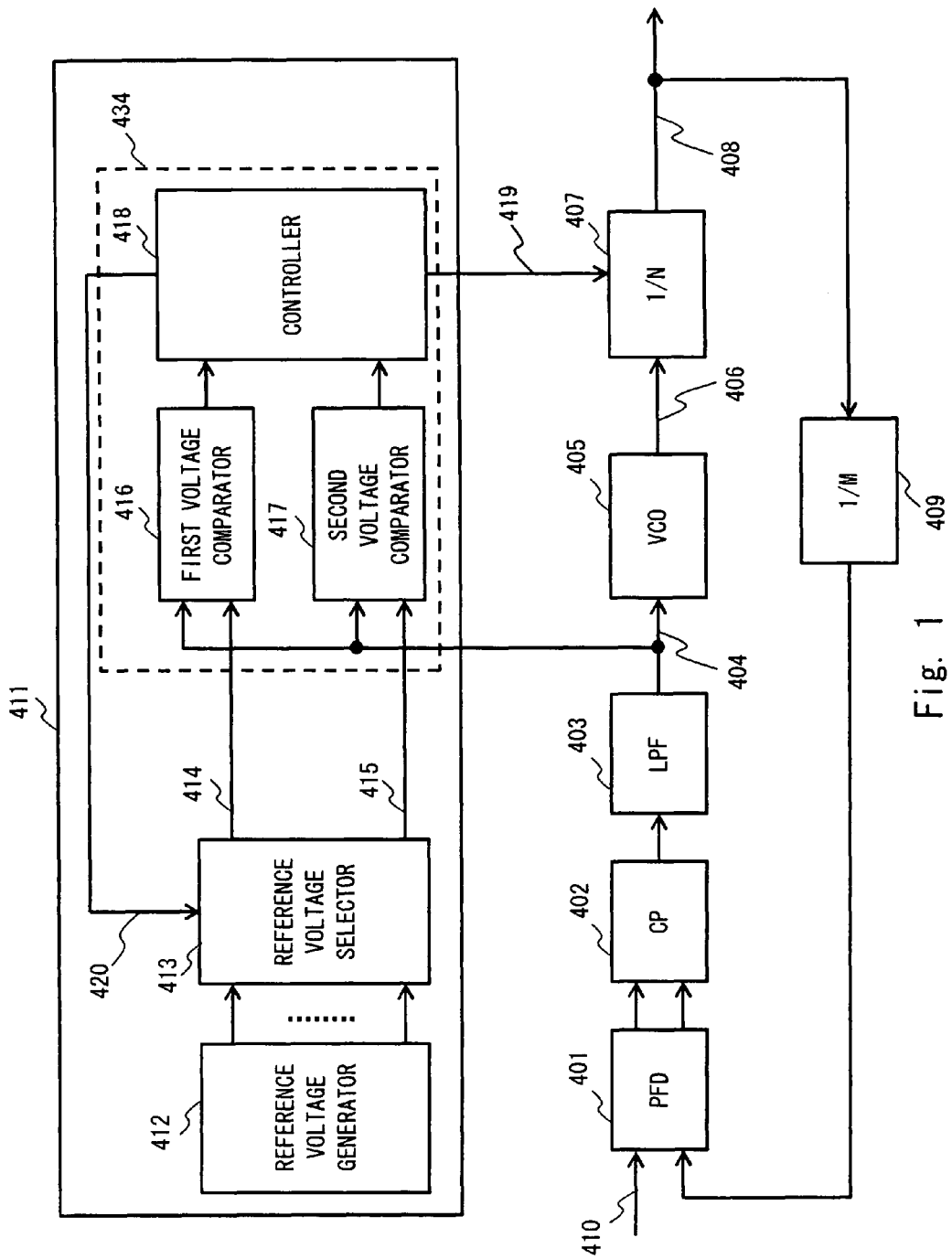
FIG. 1 is a block diagram showing a PLL circuit according to a first exemplary embodiment of the present invention.

Exemplary embodiments of the present invention will be described in detail below with reference to the accompanying drawings. In the drawings, the same components are denoted by the same reference symbols, and a redundant explanation thereof is omitted as appropriate for clarification of the explanation.

First Exemplary Embodiment

A first exemplary embodiment of the present invention will be described with reference to the drawings. FIG. 1 is a block diagram showing a PLL circuit according to the first exemplary embodiment. The PLL circuit includes a phase frequency detector (PFD) 401, a charge pump (CP) 402, a filter circuit (LPF) 403, a voltage control oscillation circuit (VCO) 405, a 1/N programmable frequency divider (frequency dividing circuit) 407, a 1/M programmable frequency divider (second frequency dividing circuit) 409, and an automatic adjustment circuit 411. The automatic adjustment circuit 411 includes a reference voltage generator (reference voltage generation circuit) 412, a reference voltage selector (reference voltage selection circuit) 413, and a comparison circuit 434. The comparison circuit 434 includes a first voltage comparator (first comparator) 416, a second voltage comparator (second comparator) 417, and a controller (control circuit) 418.

One input terminal of the PFD 401 is connected to an external input terminal. The other input terminal of the PFD 401 is connected to an output terminal of the 1/M programmable frequency divider 409. An output terminal of the PFD 401 is connected to an input terminal of the CP 402. An output terminal of the CP 402 is connected to an input terminal of the LPF 403. An output terminal of the LPF 403 is connected to each of an input terminal of the VCO 405 and an input terminal of the automatic adjustment circuit 411. An output terminal of the VCO 405 is connected to one input terminal of the 1/N programmable frequency divider 407. An output terminal of the automatic adjustment circuit 411 is connected to the other input terminal of the 1/N programmable frequency divider 407. An output terminal of the 1/N programmable frequency divider 407 is connected to each of an external output terminal and an input terminal of the 1/M programmable frequency divider 409.

Output terminals of the reference voltage generator 412 are connected to the corresponding input terminals of the reference voltage selector 413. One output terminal of the reference voltage selector 413 is connected to one input terminal of the first voltage comparator 416. The other output terminal of the reference voltage selector 413 is connected to one input terminal of the second voltage comparator 417. The other input terminal of the first voltage comparator 416 and the other input terminal of the second voltage comparator 417 are each connected to the output terminal of the LPF 403. An output terminal of the first voltage comparator 416 is connected to one input terminal of the controller 418. An output terminal of the second voltage comparator 417 is connected to the other input terminal of the controller 418. One output terminal of the controller 418 is connected to the input terminal of the 1/N programmable frequency divider 407. The other output terminal of the controller 418 is connected to an input terminal of the reference voltage selector 413.

A reference clock (reference signal) 410 externally supplied is input to one input terminal of the PFD 401. A comparison clock (feedback signal) obtained by dividing the frequency of the output clock of the PLL circuit into 1/M (M is an integer equal to or greater than 1; frequency division ratio M) is input to the other input terminal of the PFD 401. The PFD 401 detects a phase difference between the two signals and outputs a pulse signal corresponding to the phase difference. The CP 402 outputs a voltage signal corresponding to the pulse signal output from the PFD 401. The LPF 403 converts the signal output from the CP 402 into a DC signal, and outputs the DC signal as a control voltage 404. The VCO 405 outputs a clock having a frequency corresponding to the control voltage 404 as a VCO output clock 406. The 1/N programmable frequency divider 407 divides the frequency of the VCO output clock 406 into 1/N (N is an integer equal to or greater than 1; frequency division ratio N), and outputs to the outside the clock thus obtained as an output clock 408 of the PLL circuit. The 1/M programmable frequency divider 409 divides the frequency of the output clock 408 into 1/M, and outputs the clock thus obtained as the comparison clock to the PFD 401.

In the automatic adjustment circuit 411, the reference voltage selector 413 receives a plurality of reference voltages which have different potentials and are output from the reference voltage generator 412. The reference voltage selector 413 further receives a second control signal 420 output from the controller 418. The reference voltage selector 413 selectively designates any of the plurality of reference voltages based on the second control signal 420, and outputs the selected reference voltages as a first reference voltage 414 and a second reference voltage 415. One input terminal of the first voltage comparator 416 receives the first reference voltage 414. The other input terminal of the first voltage comparator 416 receives the control voltage 404. The first voltage comparator 416 outputs a result of comparison between the two received voltages to one input terminal of the controller 418. Similarly, one input terminal of the second voltage comparator 417 receives the second reference voltage 415. The other input terminal of the second voltage comparator 417 receives the control voltage 404. The second voltage comparator 417 outputs a result of comparison between the two received voltages to the other input terminal of the controller 418. The controller 418 outputs a first control signal 419 for controlling the 1/N programmable frequency divider 407, based on the signals output from the comparators 416 and 417. The controller 418 also outputs the second control signal 420 for controlling the reference voltage selector 413, based on the signals output from the comparators 416 and 417.

Figure 5:
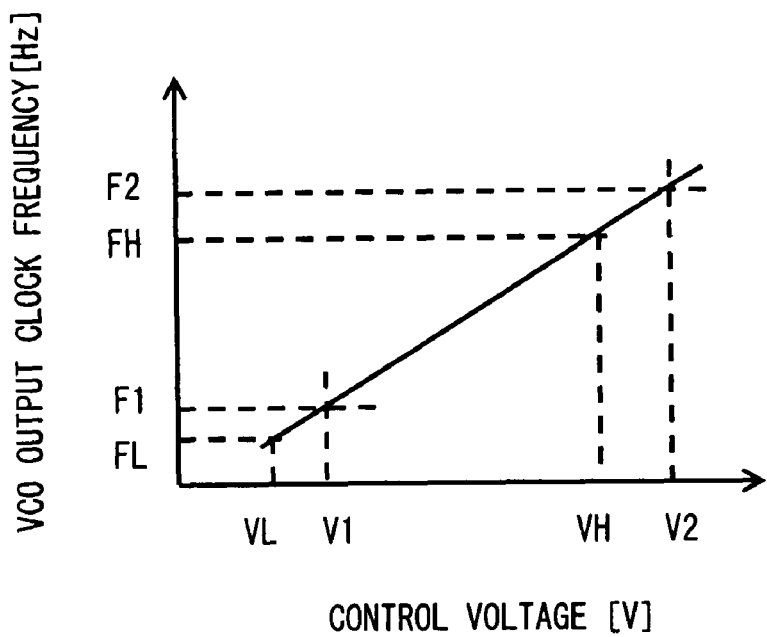
FIG. 5 is a graph showing a relation between a VCO control voltage and a VCO output clock frequency.
Figure 6:
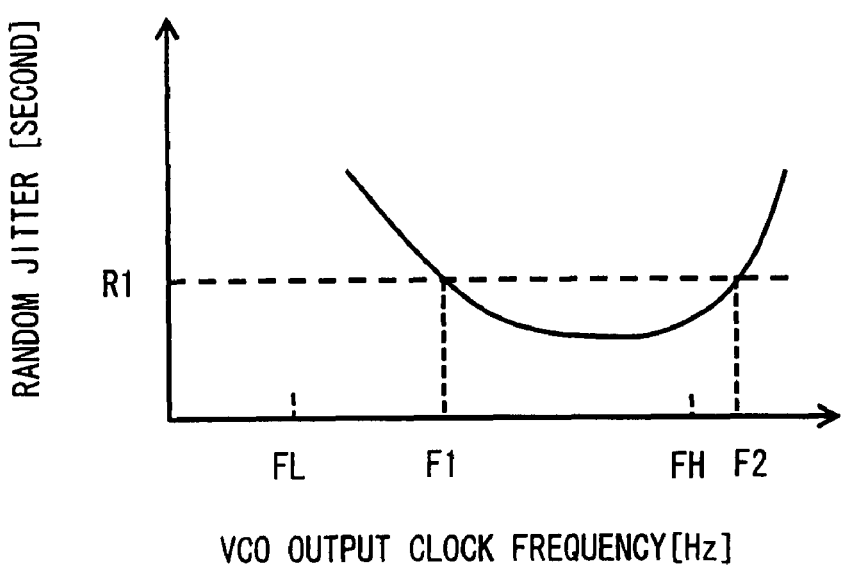
FIG. 6 is a graph showing a relation between a frequency of a VCO output clock and random jitter of the VCO output clock.

Next, the operation of the PLL circuit according to the first exemplary embodiment of the present invention will be described. FIGS. 5 and 6 are graphs showing typical relations in a PLL circuit, and thus can be applied to the case of the first exemplary embodiment. FIG. 5 shows a relation between the control voltage 404 of the VCO 405 and the frequency of the VCO output clock 406. FIG. 6 shows a relation between the frequency of the VCO output clock 406 and random jitter of the VCO output clock 406. The other components shown in FIGS. 5 and 6 are similar to those described above, so the description thereof is omitted.

First, a lower limit V1 and an upper limit V2 of the control voltage 404 are determined in advance by circuit simulation so that the random jitter of the VCO output clock 406 becomes equal to or smaller than an allowable value R1. The lower limit V1 and upper limit V2 thus obtained are set to the reference voltage generator 412.

Figure 2:
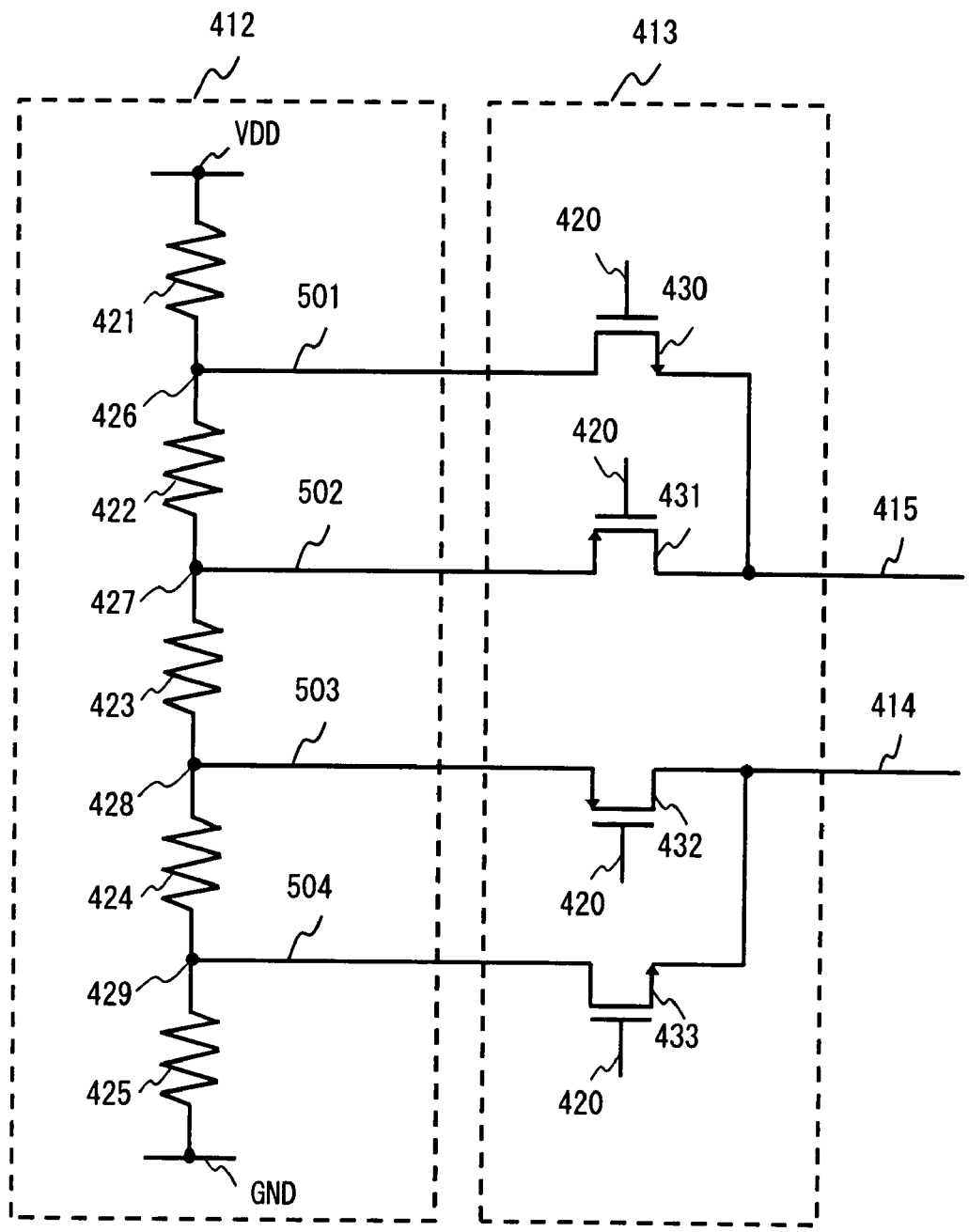
FIG. 2 is a circuit diagram showing part of an automatic adjustment circuit according to the first exemplary embodiment.

Reference is now made to FIG. 2 showing exemplary circuit configurations of the reference voltage generator 412 and the reference voltage selector 413. The reference voltage generator 412 includes resistor elements 421 to 425. The resistor elements 421 to 425 are connected in series between a power supply voltage terminal (high-potential side power supply) VDD and a ground voltage terminal (low-potential side power supply) GND. Specifically, one terminal of the resistor element 421 is connected to the power supply voltage terminal VDD. The other terminal of the resistor element 421 is connected to one terminal of the resistor element 422 through a node 426. The other terminal of the resistor element 422 is connected to one terminal of the resistor element 423 through a node 427. The other terminal of the resistor element 423 is connected to one terminal of the resistor element 424 through a node 428. The other terminal of the resistor element 424 is connected to one terminal of the resistor element 425 through a node 429. The other terminal of the resistor element 425 is connected to the ground voltage terminal GND.

The reference voltage selector 413 includes p-channel MOS transistors (hereinafter abbreviated as "PMOSs") 431 and 432, and n-channel MOS transistors (hereinafter abbreviated as "NMOSs") 430 and 433. The drain of the NMOS 430 is connected to the node 426 of the reference voltage generator 412. The source of the PMOS 431 is connected to the node 427 of the reference voltage generator 412. The source of the PMOS 432 is connected to the node 428 of the reference voltage generator 412. The drain of the NMOS 433 is connected to the node 429 of the reference voltage generator 412. The source of the NMOS 430 and the drain of the PMOS 431 are each connected to one input terminal of the second voltage comparator 417 through a common node therebetween. The drain of the PMOS 432 and the source of the NMOS 433 are each connected to one input terminal of the first voltage comparator 416 through a common node therebetween. Each of the gates of the transistors 430 to 433 receives the second control signal 420. The second control signal 420 controls turning on/off of the transistors 430 to 433.

In the reference voltage generator 412, the voltage levels at the nodes 426 to 429 can be adjusted by adjusting resistance components of the resistor elements 421 to 425. Specifically, the node 427 is set so as to indicate a reference voltage 502 corresponding to the upper limit V2. The node 426 is set so as to indicate a reference voltage 501 which is higher than the upper limit V2 by a certain value $\Delta V$ (where $\Delta V>0$). The node 428 is set so as to indicate a reference voltage 503 corresponding to the lower limit V1. The node 429 is set so as to indicate a reference voltage 504 which is lower than the lower limit V1 by the certain value $\Delta V$.

In the reference voltage selector 413, when the second control signal 420 indicates a low level, the PMOSs 431 and 432 are turned on. At the same time, the NMOSs 430 and 433 are turned off. As a result, the reference voltage selector 413 outputs the reference voltage 502 (V2) as the second reference voltage 415 and also outputs the reference voltage 503 (V1) as the first reference voltage 414. On the other hand, when the second control signal 420 indicates a high level, the NMOSs 430 and 433 are turned on. At the same time, the PMOSs 431 and 432 are turned off. As a result, the reference voltage selector 413 outputs the reference voltage 501 (V2+$\Delta V$) as the second reference voltage 415 and also outputs the reference voltage 504 (V1-$\Delta V$) as the first reference voltage 414.

In this case, when the control voltage 404 is higher than the first reference voltage 414 in the first voltage comparator 416, the output signal from the first voltage comparator 416 shifts from the low level to the high level. Meanwhile, when the control voltage 404 is lower than the first reference voltage 414 in the first voltage comparator 416, the output signal from the first voltage comparator 416 shifts from the high level to the low level. Likewise, when the control voltage 404 is higher than the second reference voltage 415 in the second voltage comparator 417, the output signal from the second voltage comparator 417 shifts from the low level to the high level. Meanwhile, when the control voltage 404 is lower than the second reference voltage 415 in the second voltage comparator 417, the output signal from the second voltage comparator 417 shifts from the high level to the low level. In this case, the first voltage comparator 416 detects a lower-limit voltage of the control voltage 404. The second voltage comparator 417 detects an upper-limit voltage of the control voltage 404.

Figure 3:
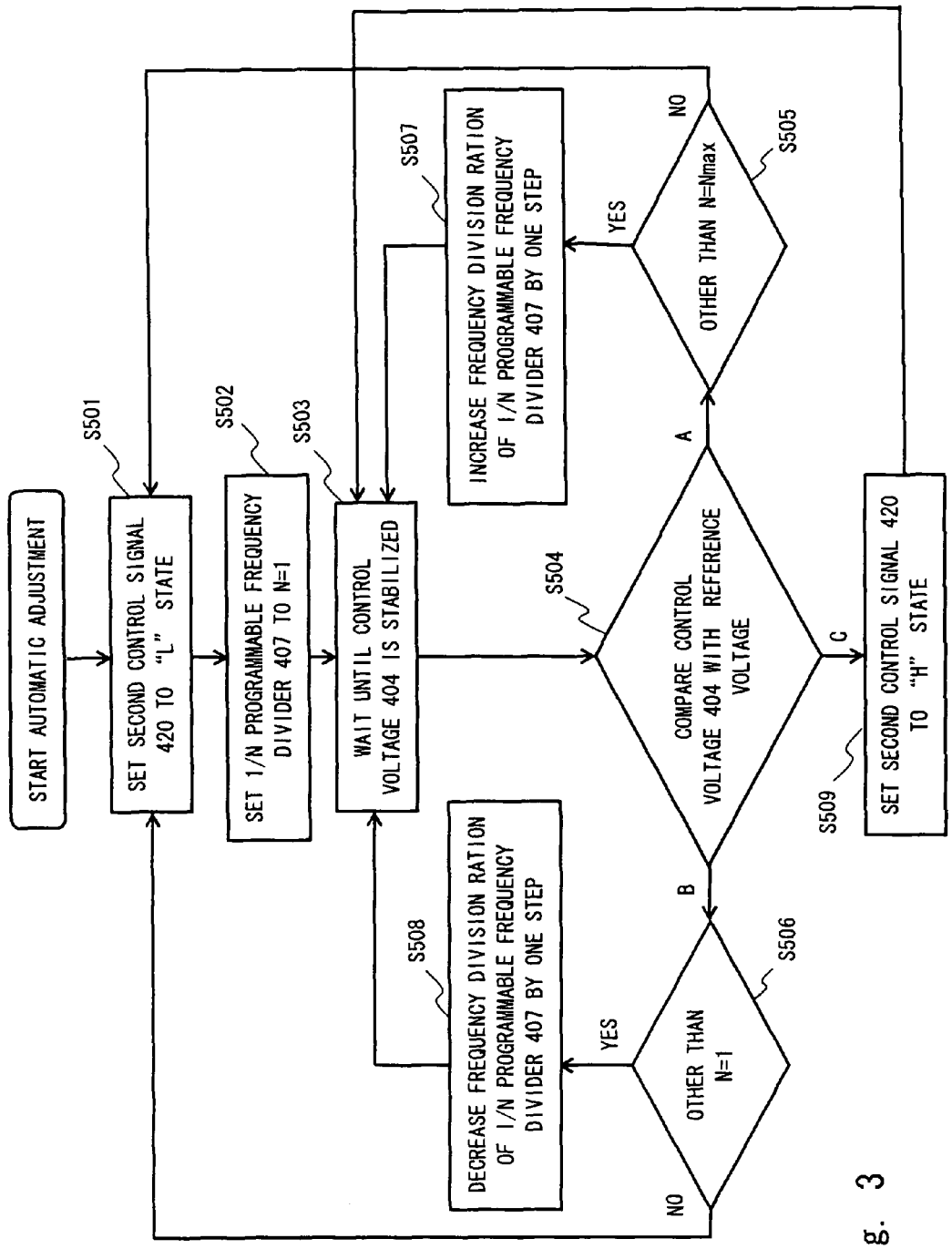
FIG. 3 is a flow chart showing processing of the automatic adjustment circuit according to the first exemplary embodiment.
Figure 4:
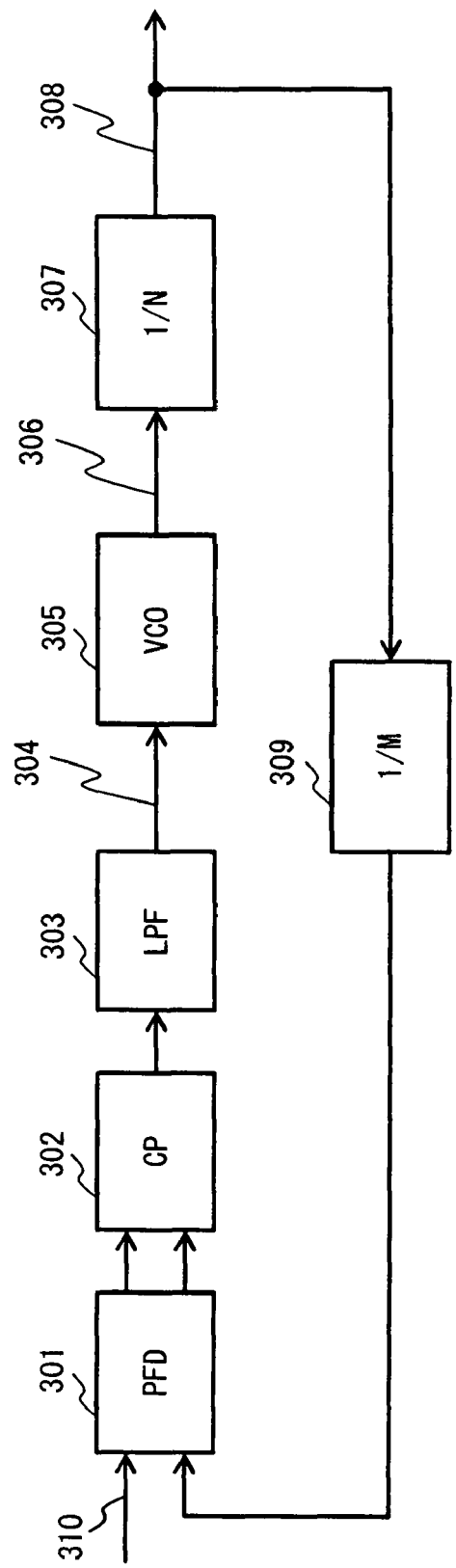
FIG. 4 is a block diagram showing a PLL circuit of a related art.

Referring next to FIG. 3, a description is given of an operation sequence of the controller 418 which automatically adjusts the frequency division ratio of the 1/N programmable frequency divider 407. First, the second control signal 420 is set to the low level, whereby the reference voltage 503 (V1) is selected as the first reference voltage 414 and the reference voltage 502 (V2) is selected as the second reference voltage 415 (S501).

Next, the frequency division ratio of the 1/N programmable frequency divider 407 is set to 1 (N=1) by the first control signal 419 (S502). Then, the controller 418 waits for a certain period of time until the control voltage 404 is stabilized (S503). After that, the first voltage comparator 416 compares the control voltage 404 with the first reference voltage 414, and the second voltage comparator 417 compares the control voltage 404 with the second reference voltage 415 (S504).

When both the output signal of the first voltage comparator 416 and the output signal of the second voltage comparator 417 are at the low level (A in S504) and when the frequency division ratio N is a maximum value Nmax (Nmax is a maximum value of the frequency division ratio N that can be taken by the 1/N programmable frequency divider 407) (NO in S505), the process returns to S501. When both the output signal of the first voltage comparator 416 and the output signal of the second voltage comparator 417 are at the low level (A in S504) and when the frequency division ratio N is a value other than the maximum value Nmax (YES in S505), the frequency division ratio N of the 1/N programmable frequency divider 407 is increased by one step by the first control signal 419 (S507). For example, the frequency division ratio N=1 is increased to a frequency division ratio N=2. That is, the frequency of the clock signal output from the 1/N programmable frequency divider 407 is decreased by one step. Then, the process returns to S503.

When both the output signal of the first voltage comparator 416 and the output signal of the second voltage comparator 417 are at the high level (B in S504) and when the frequency division ratio N is "1" (NO in S506), the process returns to S501. When both the output signal of the first voltage comparator 416 and the output signal of the second voltage comparator 417 are at the high level (B in S504) and when the frequency division ratio N is a value other than "1" (YES in S506), the frequency division ratio N of the 1/N programmable frequency divider 407 is decreased by one step by the first control signal 419 (S508). For example, the frequency division ratio N=2 is decreased to the frequency division ratio N=1. That is, the frequency of the clock signal output from the 1/N programmable frequency divider 407 is increased by one step. Then, the process returns to S503.

When the output signal of the first voltage comparator 416 is at the high level and when the output signal of the second voltage comparator 417 is at the low level (C in S504; within a normal operating range), the second control signal 420 is set to the high level (S509). Thus, the reference voltage 504 (V1-$\Delta V$) is selected as the first reference voltage 414, and the reference voltage 501 (V2+$\Delta V$) is selected as the second reference voltage 415. In other words, hysteresis characteristics are imparted to the determination results of the first voltage comparator 416 and the second voltage comparator 417. Then, the process returns to S503.

The frequency division ratio N of the 1/N programmable frequency divider 407 can be controlled at an optimum value by causing the automatic adjustment circuit 411 as described above to operate constantly. That is, even when the frequency of the output clock 408 of the PLL varies due to variations in the frequency of the reference clock 410, the frequency division ratio of the 1/N programmable frequency divider 407 can be controlled at the optimum value. In this case, no external control is required. As a result, the control voltage 404 always indicates a value within the normal operating range of the PLL circuit. In other words, the random jitter of the output clock 408 can be suppressed within an allowable value range.

Further, as shown in S509 of FIG. 3, after it is confirmed that the control voltage 404 operates within the normal operating range, hysteresis characteristics are imparted to the determination results of the voltage comparators 416 and 417. This prevents the automatic adjustment circuit 411 from excessively responding to a slight fluctuation of the control voltage 404 due to ripple voltage or the like.

For example, as shown in FIG. 6, the upper limit of the random jitter of the VCO output clock 406, which is allowed by the PLL circuit, is represented by R1. The minimum value of the frequency of the VCO output clock 406, the random jitter of which indicates a value equal to or smaller than the allowable value R1, is represented by F1. The maximum value of the frequency of the VCO output clock 406, the random jitter of which indicates a value equal to or smaller than the allowable value R1, is represented by F2. In this case, when the frequency division ratio of the 1/N programmable frequency divider 407 is set to 1 (N=1), the minimum frequency of the VCO output clock 406, which is requested by applications using the PLL circuit, is represented by FL. Additionally, the maximum frequency of the VCO output clock 406 at the time is represented by FH. It is assumed that relations FH>FL, F2>FH, F1>FL, and F2>(F1×2) are given.

Figure 7:
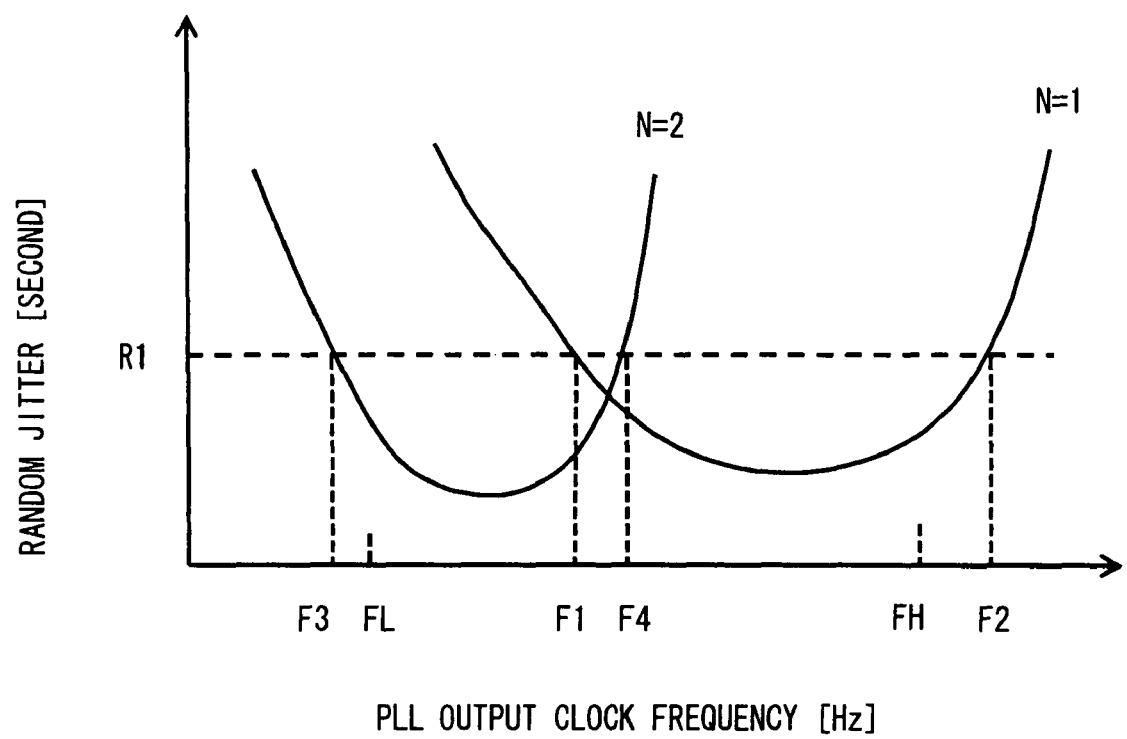
FIG. 7 is a graph showing a relation between a frequency of an output clock of the PLL circuit and random jitter of the output clock.
Figure 8:
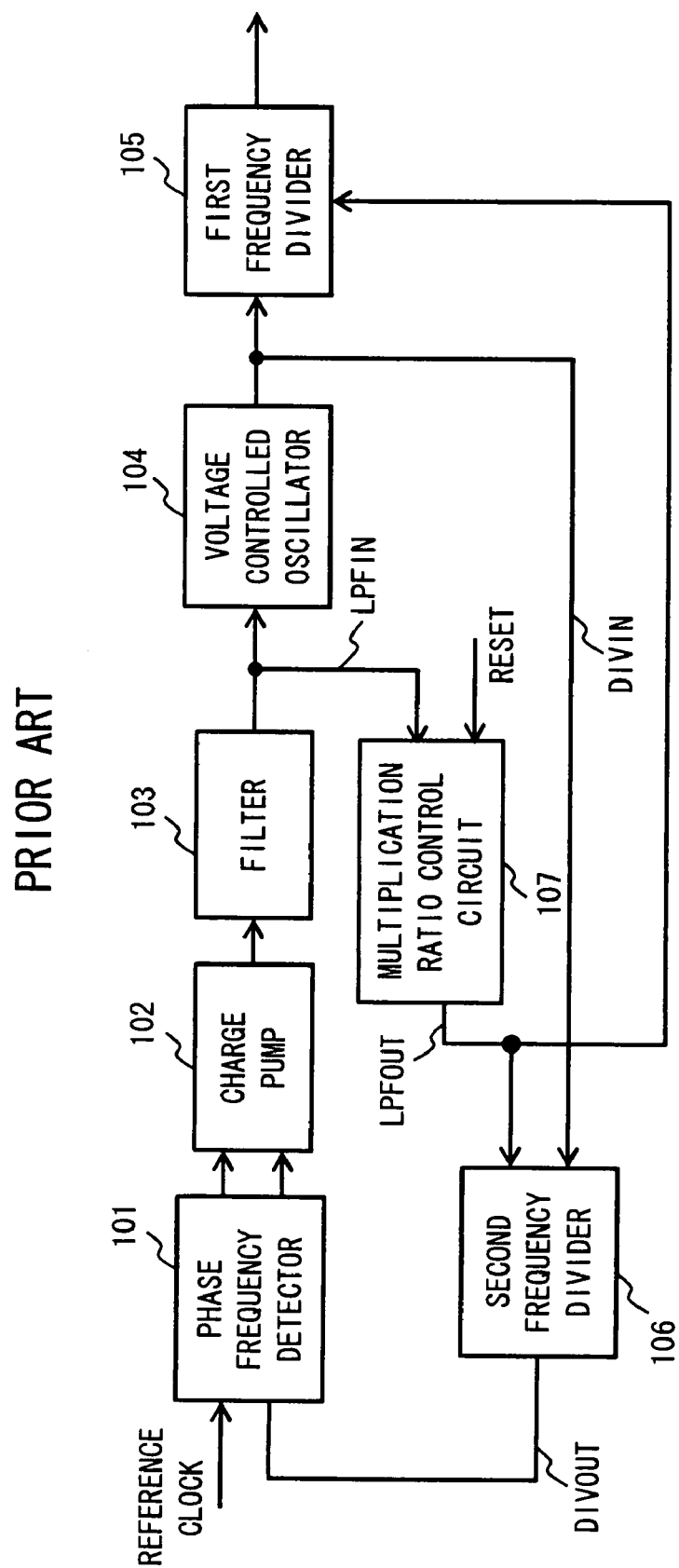
FIG. 8 is a block diagram showing a PLL circuit disclosed in Japanese Unexamined Patent Application Publication No. 2005-143030.
Figure 9:
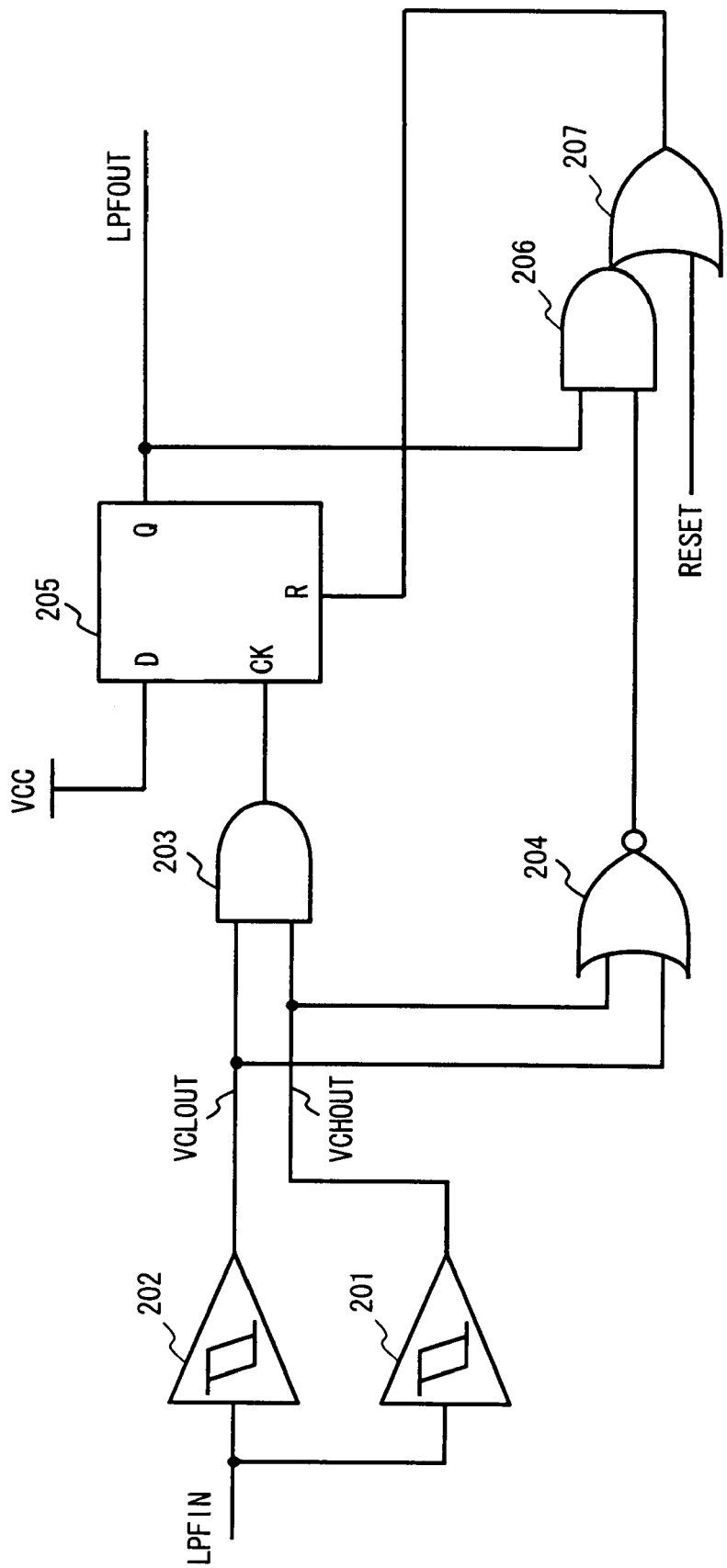
FIG. 9 is a circuit diagram showing an exemplary multiplication ratio control circuit disclosed in Japanese Unexamined Patent Application Publication No. 2005-143030.
Figure 10:
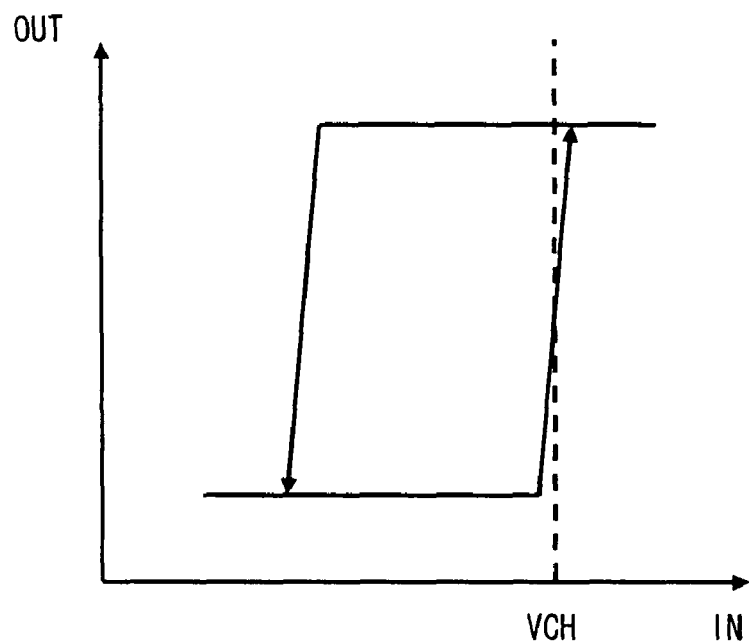
FIG. 10 is a diagram showing input/output characteristics of a Schmitt trigger circuit disclosed in Japanese Unexamined Patent Application Publication No. 2005-143030.
Figure 11:
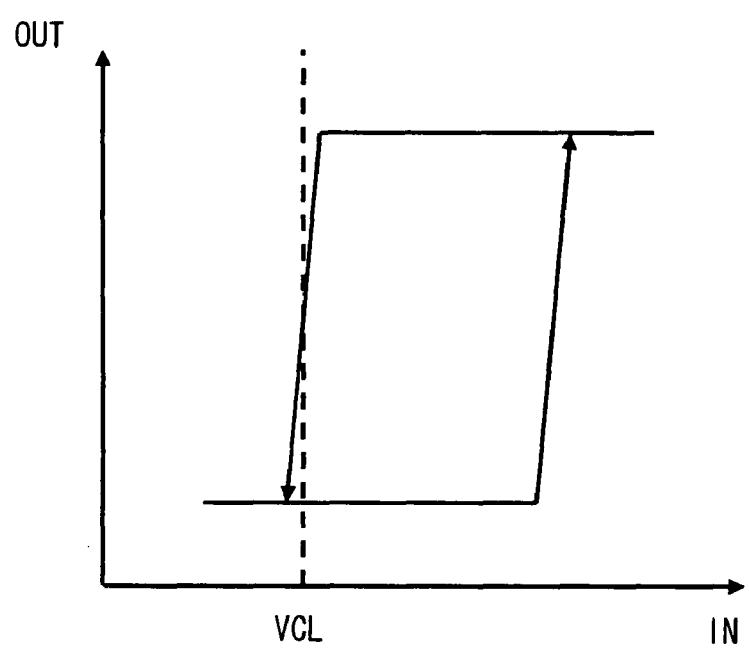
FIG. 11 is a diagram showing input/output characteristics of the Schmitt trigger circuit disclosed in Japanese Unexamined Patent Application Publication No. 2005-143030.
Figure 12:
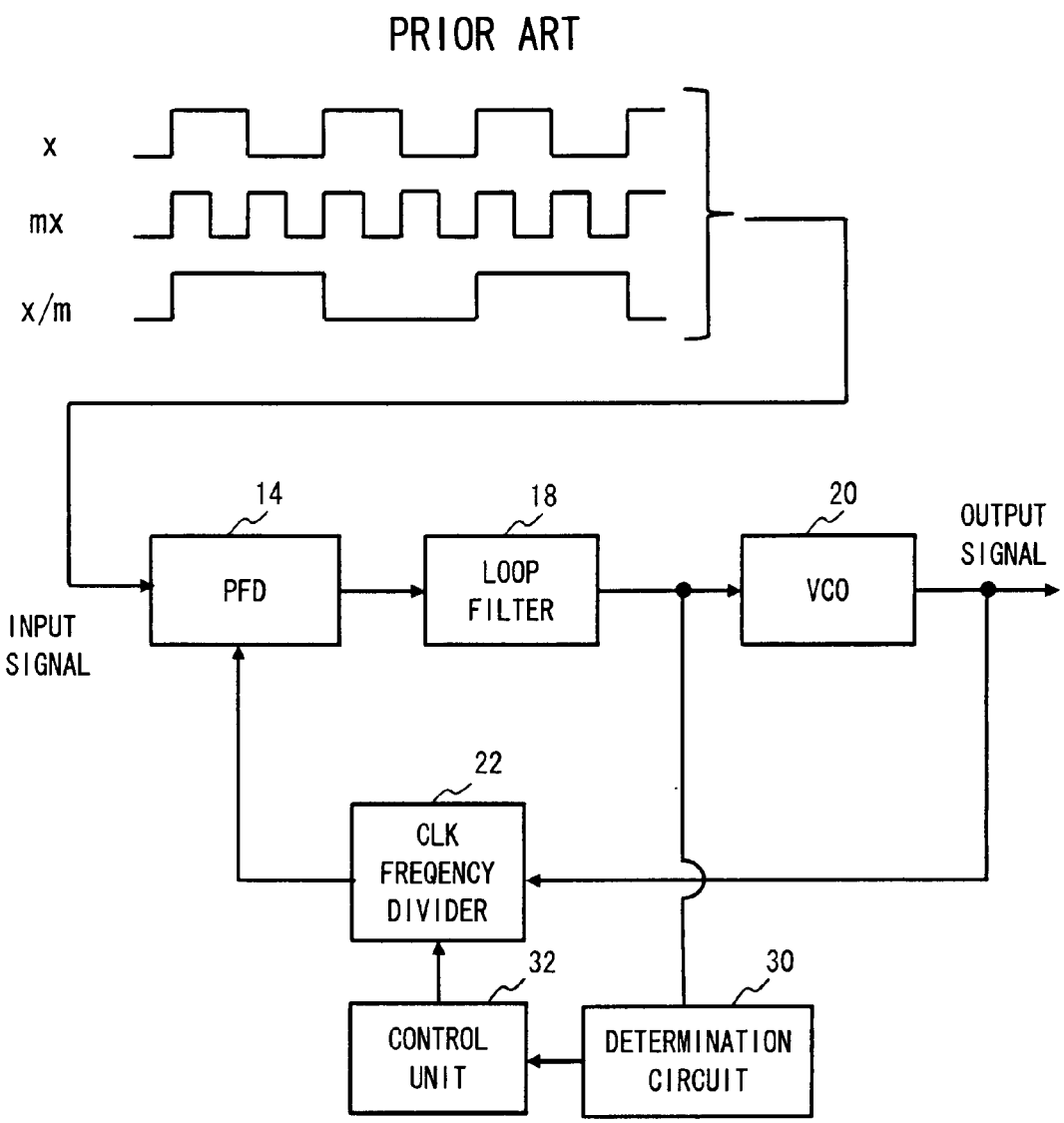
FIG. 12 is a block diagram showing a PLL circuit disclosed in Published Japanese Translation of PCT International Publication for Patent Application, No. 2001-520471.
Figure 13:
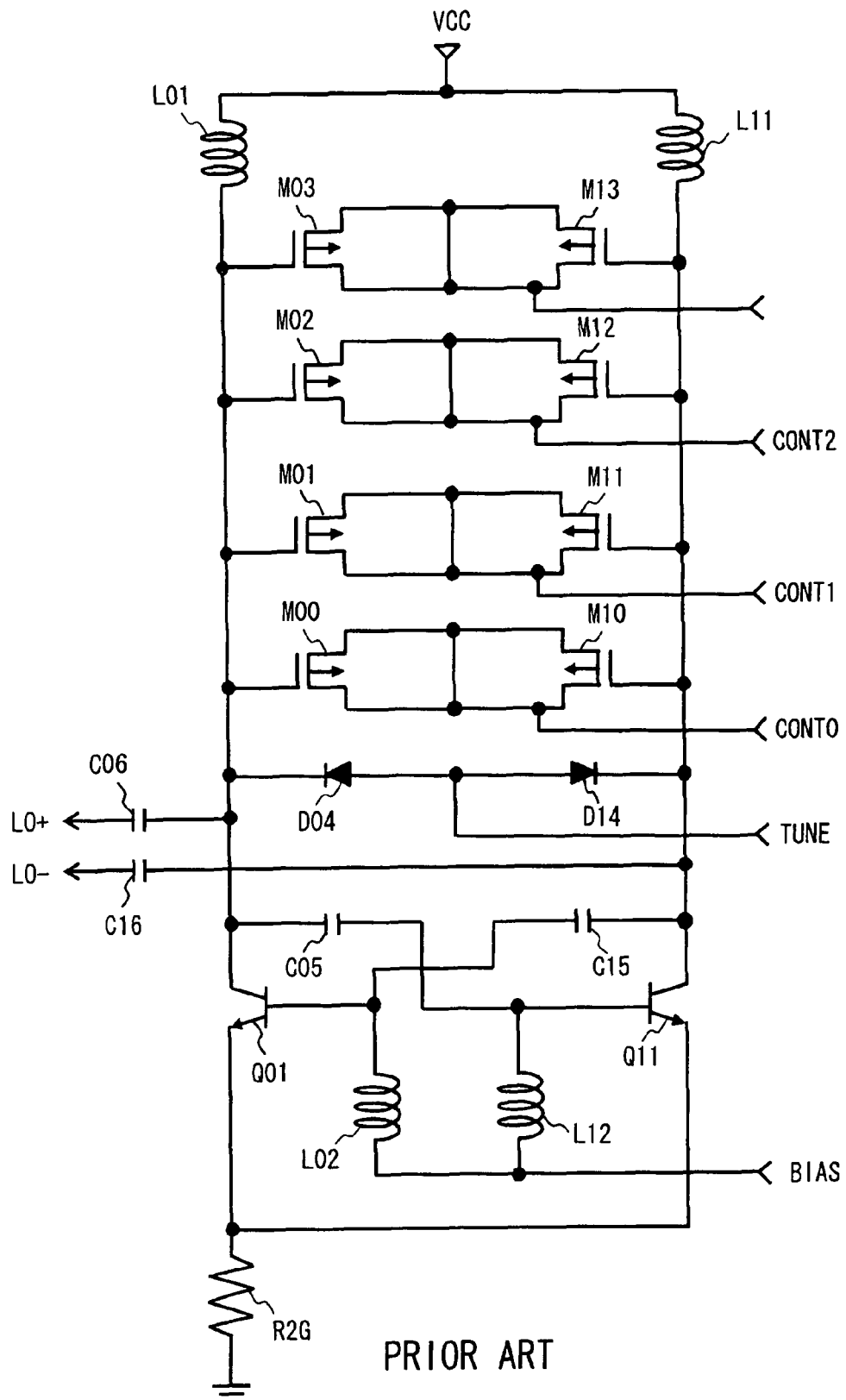
FIG. 13 is a circuit diagram showing a configuration of a voltage control variable frequency oscillator disclosed in Japanese Unexamined Patent Application Publication No. 2002-208857.

At this time, when the frequency of the VCO output clock 406 is near the minimum frequency FL, it is obvious that the random jitter exceeds the allowable value R1. In this case, the frequency division ratio of the 1/N programmable frequency divider 407 is controlled at "2" (N=2), for example, by the automatic adjustment circuit 411. FIG. 7 shows a relation between the frequency of the output clock 408 of the PLL circuit and the random jitter of the output clock 408 at this time. When N=2, the minimum value of the frequency of the VCO output clock 406, the random jitter of which indicates a value equal to or smaller than the allowable value R1, is represented by F3. The maximum value of the VCO output clock 406 at the time is represented by F4. As shown in the example of FIG. 7, F3 indicates a value smaller than FL (FL>F3). Accordingly, when the frequency of the output clock 408 of the PLL circuit indicates a value within the range from FL to FH, the random jitter can be controlled at a value equal to or smaller than the allowable value R1. Therefore, requests from applications using the PLL circuit can be satisfied.

As described above, in the PLL circuit according to an exemplary embodiment of the present invention, the reference voltage generator 412 and the reference voltage selector 413 generate the two reference voltages 414 and 415 respectively corresponding to the lower limit V1 and the upper limit V2 of the control voltage 404. For example, the voltage range between the lower limit V1 and the upper limit V2 is a voltage range in which the random jitter of the VCO output clock 406 indicates a value equal to or smaller than the allowable value R1. The comparison between the two reference voltages 414 and 415 and the VCO control voltage 404 makes it possible to detect that the control voltage 404 falls within a predetermined voltage range. After the frequency division ratio of the 1/N programmable frequency divider is once set to an appropriate value, the first reference voltage 414 is changed from V1 to V1−ΔV, and the second reference voltage 415 is changed from V2 to V2+ΔV. This prevents the automatic adjustment circuit 411 from excessively responding to a slight fluctuation of the control voltage 404 due to ripple voltage or the like. Consequently, the operation of the PLL circuit can be stabilized.

The present invention is not limited to the above exemplary embodiment, and various modifications can be made without departing from the scope of the present invention. Though the example where two types of reference voltages and two comparators corresponding to the voltages are used has been described in the above exemplary embodiment, the present invention is not limited thereto. For example, a circuit configuration employing three or more types of reference voltages and three or more comparators corresponding to the voltages can be used. Alternatively, a circuit configuration employing one type of reference voltage and a single comparator corresponding to the voltage can also be used. While the example where the automatic adjustment circuit 411 constantly operates has been described in the above exemplary embodiment, the present invention is not limited thereto. A circuit configuration for suspending the automatic adjustment circuit 411 by a control signal externally supplied can also be employed.

While the example where the reference voltage selector 413 includes MOS transistors has been described in the above exemplary embodiment, the configuration of the reference voltage selector 413 is not limited thereto. The reference voltage selector 413 may include other switching elements.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A PLL circuit comprising:
   a phase frequency detector that detects a phase difference between a reference signal and a feedback signal;
   a filter circuit that outputs a control voltage based on an output signal from the phase frequency detector;
   a voltage control oscillation circuit that controls a frequency of a clock signal output based on the control voltage;
   a frequency dividing circuit that divides the frequency of the clock signal and outputs the feedback signal; and
   an automatic adjustment circuit that adjusts a frequency division ratio of the frequency dividing circuit based on the control voltage,
   wherein the automatic adjustment circuit comprises:
      a comparison circuit that outputs a first control signal for controlling the frequency division ratio based on a potential difference between the control voltage and a first reference voltage, and outputs a second control signal for controlling the first reference voltage based on the potential difference between the control voltage and the first reference voltage; and
      a reference voltage selection circuit that selects the first reference voltage based on the second control signal and outputs the first reference voltage selected.

2. The PLL circuit according to claim 1, wherein
   the comparison circuit outputs the first control signal and the second control signal based on a potential difference between the control voltage and a second reference voltage as well as on the potential difference between the control voltage and the first reference voltage, and
   the reference voltage selection circuit selects the second reference voltage as well as the first reference voltage based on the second control signal, and outputs the first reference voltage and second reference voltage selected.

3. The PLL circuit according to claim 2, wherein when the control voltage falls within a voltage range between the first reference voltage and the second reference voltage, the reference voltage selection circuit selects and outputs the first reference voltage and the second reference voltage so as to increase the voltage range.

4. The PLL circuit according to claim 2, wherein the comparison circuit comprises:
- a first comparator that detects the potential difference between the first reference voltage and the control voltage;
- a second comparator that detects the potential difference between the second reference voltage and the control voltage; and
- a control circuit that outputs the first control signal and the second control signal based on comparison results of the first comparator and the second comparator.

5. The PLL circuit according to claim 1, wherein
the automatic adjustment circuit further comprises a reference voltage generation circuit that generates a plurality of reference voltages having different potentials, based on a voltage drop of resistor elements connected in series between a high-potential side power supply and a low-potential side power supply, and
the reference voltage selection circuit selects and outputs any of the plurality of reference voltages.

6. The PLL circuit according to claim 2, wherein
the automatic adjustment circuit further comprises a reference voltage generation circuit that generates a plurality of reference voltages having different potentials, based on a voltage drop of resistor elements connected in series between a high-potential side power supply and a low-potential side power supply, and
the reference voltage selection circuit selects and outputs any of the plurality of reference voltages.

7. The PLL circuit according to claim 1, further comprising a second frequency dividing circuit that is provided between the frequency dividing circuit and the phase frequency detector, divides a frequency of the feedback signal, and outputs the feedback signal to the phase frequency detector.

8. The PLL circuit according to claim 2, further comprising a second frequency dividing circuit that is provided between the frequency dividing circuit and the phase frequency detector, divides a frequency of the feedback signal, and outputs the feedback signal to the phase frequency detector.

9. The PLL circuit according to claim 7, wherein the frequency dividing circuit outputs the feedback signal to the second frequency dividing circuit and also to an outside as an output clock signal.

10. The PLL circuit according to claim 8, wherein the frequency dividing circuit outputs the feedback signal to the second frequency dividing circuit and also to an outside as an output clock signal.

11. A method of controlling a PLL circuit, comprising:
- detecting a phase difference between a reference signal and a feedback signal;
- generating a control voltage based on the phase difference;
- controlling a frequency of a clock signal output based on the control voltage;
- controlling a frequency division ratio of the clock signal based on a potential difference between the control voltage and a first reference voltage, to generate the feedback signal; and
- controlling the first reference voltage based on the potential difference between the control voltage and the first reference voltage.

12. The method of controlling a PLL circuit according to claim 11, wherein
the feedback signal is generated by controlling the frequency division ratio of the clock signal based on a potential difference between the control voltage and a second reference voltage as well as on the potential difference between the control voltage and the first reference voltage, and
the first reference voltage and the second reference voltage are controlled based on the potential difference between the control voltage and the second reference voltage as well as on the potential difference between the control voltage and the first reference voltage.

13. The method of controlling a PLL circuit according to claim 12, wherein when the control voltage falls within a voltage range between the first reference voltage and the second reference voltage, the first reference voltage and the second reference voltage are controlled so as to increase the voltage range between the first reference voltage and the second reference voltage.

* * * * *